US008743916B2

(12) United States Patent
Yamamoto et al.

(10) Patent No.: US 8,743,916 B2
(45) Date of Patent: Jun. 3, 2014

(54) PLANE WAVEGUIDE TYPE LASER AND DISPLAY DEVICE

(75) Inventors: Shuhei Yamamoto, Tokyo (JP); Yosuke Akino, Tokyo (JP); Takayuki Yanagisawa, Tokyo (JP); Yoshihito Hirano, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 364 days.

(21) Appl. No.: 13/141,910

(22) PCT Filed: Feb. 5, 2009

(86) PCT No.: PCT/JP2009/051941
§ 371 (c)(1),
(2), (4) Date: Jun. 23, 2011

(87) PCT Pub. No.: WO2010/089866
PCT Pub. Date: Aug. 12, 2010

(65) Prior Publication Data
US 2011/0255562 A1    Oct. 20, 2011

(51) Int. Cl.
*H01S 3/109* (2006.01)
(52) U.S. Cl.
USPC ............... 372/21; 372/22; 372/29.02; 372/70
(58) Field of Classification Search
USPC ......................................................... 372/21
See application file for complete search history.

(56) References Cited

U.S. PATENT DOCUMENTS

| 5,132,980 A | 7/1992 | Connors et al. | |
| 6,188,708 B1 * | 2/2001 | Schmitt et al. | 372/50.22 |
| 7,054,340 B1 * | 5/2006 | Hillmer et al. | 372/20 |
| 7,839,908 B2 * | 11/2010 | Yanagisawa et al. | 372/36 |
| 2003/0214993 A1 * | 11/2003 | Baker | 372/92 |
| 2008/0095202 A1 | 4/2008 | Yanagisawa et al. | |
| 2010/0189151 A1 | 7/2010 | Yanagisawa et al. | |
| 2010/0303112 A1 | 12/2010 | Yamamoto et al. | |

FOREIGN PATENT DOCUMENTS

| JP | 58-189553 U | 12/1983 |
| JP | 2-146784 | 6/1990 |
| JP | 5-75184 | 3/1993 |
| JP | 2001-203410 | 7/2001 |

(Continued)

OTHER PUBLICATIONS

International Search Report issued Mar. 3, 2009 in PCT/JP2009/051941.
Jacob I. MacKenzie, et al. "Multi-Watt, High Efficiency, Diffraction-Limited Nd:YAG Planar Waveguide Laser", IEEE Journal of Quantum Electronics, vol. 39, No. 3, Mar. 2003, pp. 493-500.

(Continued)

*Primary Examiner* — Xinning Niu
(74) *Attorney, Agent, or Firm* — Oblon, Spivak, McClelland, Maier & Neustadt, L.L.P.

(57) ABSTRACT

A plane waveguide type laser includes: a plate-shaped laser medium; a semiconductor laser which causes excitation light to enter an end surface of the laser medium; first and second claddings which are bonded to lower and upper surfaces of the laser medium, respectively, to form a waveguide in a vertical direction; a comb heat sink bonded to a lower surface of the first cladding; and a thermal lens producing portion bonded to an upper surface of the second cladding. In this structure, laser oscillation in the vertical direction is performed in a waveguide mode of the laser medium, and the thermal lens producing portion forms a periodic lens effect in the laser medium to perform laser oscillation in a lateral direction in a plurality of resonant modes.

11 Claims, 16 Drawing Sheets

(56) References Cited

FOREIGN PATENT DOCUMENTS

| WO | WO 2005/033791 A1 | 4/2005 |
| WO | WO 2006/103767 A1 | 10/2006 |
| WO | WO 2007/013608 A1 | 2/2007 |

OTHER PUBLICATIONS

Yoshihito Hirano, et al., "Planer Doharo Array Naibu Nacho Henkan Green Laser (1)—Kosei", Dai 69 Kai Extended Abstracts, The Japan Society of Applied Physics, Sep. 2, 2008, Separate vol. 3, p. 939.
U.S. Appl. No. 13/416,460, filed Mar. 9, 2012, Yanagisawa, et al.

* cited by examiner (c1)

(c2)

(a)

(b)

(a)

(b)

(a)

(b)

(a)

(b)

PLANE WAVEGUIDE TYPE LASER AND DISPLAY DEVICE

TECHNICAL FIELD

The present invention relates to a plane waveguide type laser and a display device using the same, and more particularly, to a plane waveguide type laser, for example, a high-power laser device or a wavelength conversion laser device, which is suitable for a light source for a printer, a laser television set, or a laser processing machine, and also to a display device using the same.

BACKGROUND ART

A printer and a projection television set require a light source for three colors of red (R), green (G), and blue (B). As the light source, there has been developed a wavelength conversion laser in which laser light of 900 nm band, 1 μm band, or 1.3 μm band is used as fundamental laser light and the fundamental laser light is wavelength-converted into harmonic laser light, for example, second harmonic generation (SHG) light or third harmonic generation (THG) light by a nonlinear material. In order to realize high conversion efficiency from the fundamental laser light to the harmonic laser light in the case of harmonic, the fundamental laser light on the nonlinear material is required to high power density and also high-intensity laser light having less wavefront aberration is required.

In a two-dimensional waveguide type laser, the power density of the fundamental laser light may be increased, and hence the high conversion efficiency to the harmonic laser light may be realized. In contrast, the increase in power is limited because of a breakdown limit accompanying the high-power density. LD light, which may be coupled to a two-dimensional waveguide and has excellent beam quality in a two-dimensional direction, is also limited, and hence the increase in power is limited.

In order to realize the wavelength conversion laser device as described above, a plane waveguide type laser having a one-dimensional waveguide may be used (see, for example, Patent Document 1). In the plane waveguide type laser, laser oscillation is performed within a plate surface in a direction vertical to a laser light axis in a spatial mode, and a beam diameter of laser light is increased in the direction or a multi-beam is formed, to thereby achieve high power. In such a laser, the LD light which is an excitation source only needs to be coupled to a plane waveguide in a one-dimensional direction, and hence a high-power broad area LD may be used and thus high-power laser light may be obtained. A multi-emitter LD in which light emitting points for LD light are arranged in the one-dimensional direction may be used, and hence higher-laser power may be obtained.

In the one-dimensional plane waveguide type laser, the laser light is confined in the waveguide in the waveguide direction, and hence a stable operation may be ensured. In contrast, the laser light spatially propagates in the plane direction, and hence it is necessary to provide a curvature mirror or a lens in a laser resonator in order to ensure the stable operation.

FIG. 13 illustrates a conventional structure. In FIG. 13, reference numeral 1 denotes a semiconductor laser, 2 denotes a comb heat sink, 3 denotes a bonding material, 4 denotes a cladding (low-refractive index portion) bonded to an upper surface of the heat sink 2 by the bonding material 3, 5 denotes a laser medium provided on an upper surface of the cladding 4, 5a and 5b denote end surfaces of the laser medium 5, and 6 denotes an optical axis indicating a laser oscillation direction of the semiconductor laser 1. In the structure illustrated in FIG. 13, excitation light from the semiconductor laser 1 enters the laser medium 5 via the end surface 5a of the laser medium 5 and is absorbed in the laser medium 5 to produce a gain for fundamental laser light in the laser medium 5. The fundamental laser light is emitted from the end surface 5b perpendicular to the optical axis 6 of the laser medium 5 at the gain produced in the laser medium 5.

In this case, in the structure illustrated in FIG. 13, heat generated in the laser medium 5 is discharged through the comb heat sink 2. In such a structure, a temperature distribution as illustrated in FIG. 14($a$) is caused in the laser medium 5, and the flow of heat as illustrated in FIG. 14($b$) occurs. When the laser medium 5 is excited by the semiconductor laser 1, heat generates depending on a wavelength difference between a wavelength of the excitation light from the semiconductor laser 1 and a wavelength of the light generated in the laser medium 5. Then, a temperature of the laser medium 5 increases because of excitation. A refractive index of the laser medium 5 becomes higher as the temperature thereof increases, and hence a lens effect is produced. Such a lens is called a thermal lens. The thermal lens is produced during the laser operation, and hence a stable laser operation may be performed without the need to provide an optical part, for example, a curvature mirror or a lens in the plane direction. Thus, both ends of the laser resonator may be provided to have a flat surface, and hence there is an advantage that laser power is obtained by a simple structure.

In the laser in which the resonator is formed by the thermal lens as described above, the power of the thermal lens (lens power) is required to be set in a range in which the laser resonator operates stably. In any of the cases where the power of a used thermal lens is smaller and larger than the power of a thermal lens in which a stable laser operation condition is obtained, the laser is not oscillated. In contrast, when the thermal lens is used in the range in which the stable operation condition is obtained, laser output is obtained. Even the thermal lens in the range of the stable operation condition has a feature that, when the laser is in a condition close to a non-oscillation condition, a laser resonance loss caused in the laser resonator is so large, that the laser power is low. Therefore, in order to obtain stable laser power, the thermal lens is required to have lens power in a predetermined range which is determined by the laser resonator. Thus, when the amount of heat generated in the laser medium 5 and the shape and heat capacity of the comb heat sink 2 are suitably set, the lens power of the thermal lens may be set in the stable operation range. In such a case, when the thermal lens is in a stable steady state, the high-power laser output may be stably obtained.

However, a transient response of the thermal lens occurs at the rising of pulse operation or continuous-wave (CW) operation. Heat is not generated before the operation of the laser, and hence there is no thermal lens. When heat starts to generate by excitation by the semiconductor laser, the lens power of the thermal lens increases with a time constant determined based on the amount of heat and the shape and heat capacity of the comb heat sink 2. After a lapse of a predetermined time, the lens power becomes a steady state. In this case, the lens power of the thermal lens is 0 at the instant when the excitation starts, and gradually increases with time. Therefore, the laser is in the non-oscillation state during a period from the instant when the excitation starts to the formation of the thermal lens in which the stable laser operation condition is obtained. In addition, when the lens power becomes larger, the output increases. In the case of the lens power which is in the steady state, the loss of the laser resonator is small, and hence high-power laser light is stably obtained.

Patent Document 1: WO 2005/033791 A1

DISCLOSURE OF THE INVENTION

Problem to be solved by the Invention

The plane waveguide type laser in which the stable operation is ensured by the use of the thermal lens in the plane direction has a problem that, during the transient response operation of the thermal lens, for example, at the rising of pulse operation or continuous-wave (CW) operation, the time stability of output is low, for example, the laser may become the non-oscillation state or the laser power may become low.

The present invention has been made to solve the problem. An object of the present invention is to obtain a plane waveguide type laser in which the same laser power as in the steady state may be obtained from the instant when the excitation starts, and to obtain a display device using the same.

Means for solving the Problem

According to the present invention, a plane waveguide type laser includes: a laser medium which is substantially plate-shaped; a semiconductor laser which is provided close to one end surface of the laser medium on an optical axis of the laser medium, for causing excitation light to enter the laser medium; a first cladding which is bonded to a lower surface of the laser medium to form a waveguide in a vertical direction to the laser medium; a second cladding which is bonded to an upper surface of the laser medium to form the waveguide in the vertical direction to the laser medium; a heat sink bonded to a lower surface of the first cladding; a wavelength selection waveguide which is provided close to an other end surface of the laser medium on the optical axis of the laser medium, for reflecting laser light having a predetermined wavelength which is apart of fundamental laser light exiting from the laser medium, and transmitting laser light having other wavelengths; and thermal lens producing means bonded to an upper surface of the second cladding, in which: laser oscillation in the vertical direction is performed in a waveguide mode of the laser medium or the wavelength selection waveguide; in a lateral direction, the thermal lens producing means forms a periodic lens effect in the laser medium so that laser oscillation is performed in a plurality of resonant modes; and the wavelength selection waveguide includes a nonlinear material, and converts the fundamental laser light entering the wavelength selection waveguide into laser light having a different wavelength to output the laser light.

Effects of the Invention

According to the present invention, the plane waveguide type laser includes: the laser medium which is substantially plate-shaped; the semiconductor laser which is provided close to one end surface of the laser medium on the optical axis of the laser medium, for causing the excitation light to enter the laser medium; the first cladding which is bonded to the lower surface of the laser medium to form the waveguide in the vertical direction to the laser medium; the second cladding which is bonded to the upper surface of the laser medium to form the waveguide in the vertical direction to the laser medium; the heat sink bonded to the lower surface of the first cladding; the wavelength selection waveguide which is provided close to an other end surface of the laser medium on the optical axis of the laser medium, for reflecting laser light having a predetermined wavelength which is a part of fundamental laser light exiting from the laser medium, and transmitting laser light having other wavelengths; and the thermal lens producing means bonded to the upper surface of the second cladding, in which: the laser oscillation in the vertical direction is performed in the waveguide mode of the laser medium or the wavelength selection waveguide; in the lateral direction, the thermal lens producing means forms the periodic lens effect in the laser medium so that laser oscillation is performed in the plurality of resonant modes; and the wavelength selection waveguide includes the nonlinear material, and converts the fundamental laser light entering the wavelength selection waveguide into laser light having a different wavelength to output the laser light. Therefore, the same laser power as in the steady state may be obtained from the instant when the excitation starts.

BEST MODE FOR CARRYING OUT THE INVENTION

Hereinafter, in order to describe the present invention in more detail, a best mode for carrying out the invention is described with reference to the attached drawings.

Embodiment 1.

Figure 1A:
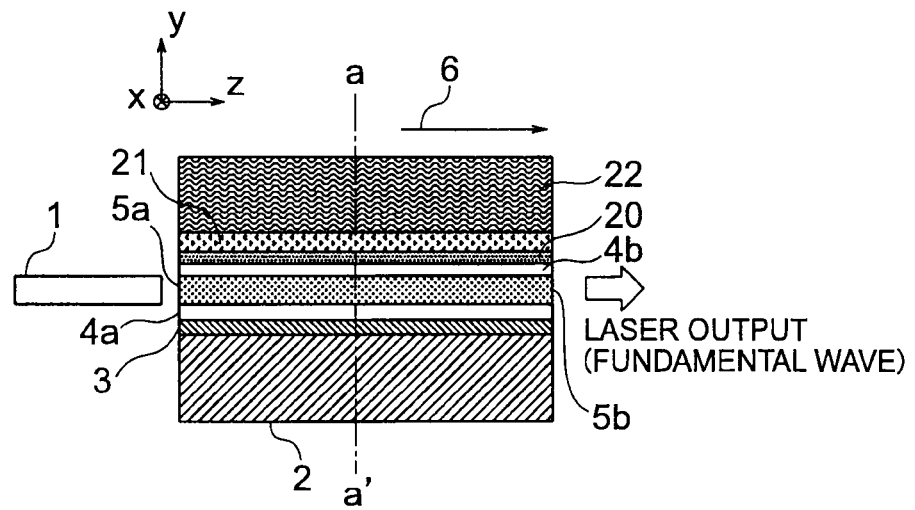
[FIG. 1A] A side view illustrating a structure of a plane waveguide type laser according to Embodiment 1 of the present invention.
Figure 1B:
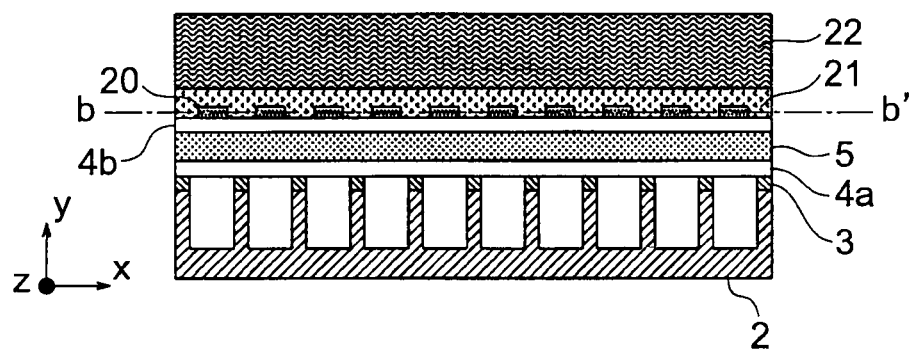
[FIG. 1B] A cross sectional view illustrating the structure of the plane waveguide type laser according to Embodiment 1 of the present invention.
Figure 1C:
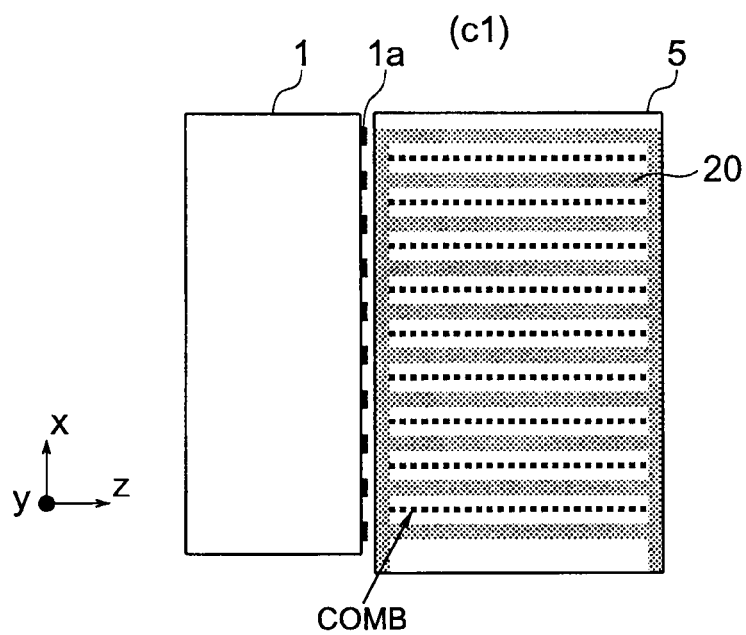
[FIG. 1C] A cross sectional view illustrating the structure of the plane waveguide type laser according to Embodiment 1 of the present invention.
Figure 1C:
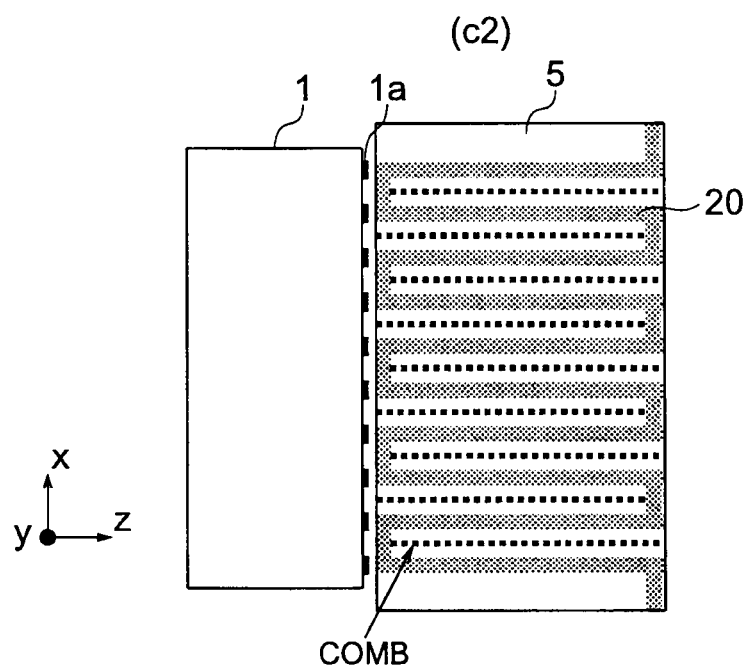
Figure 1D:
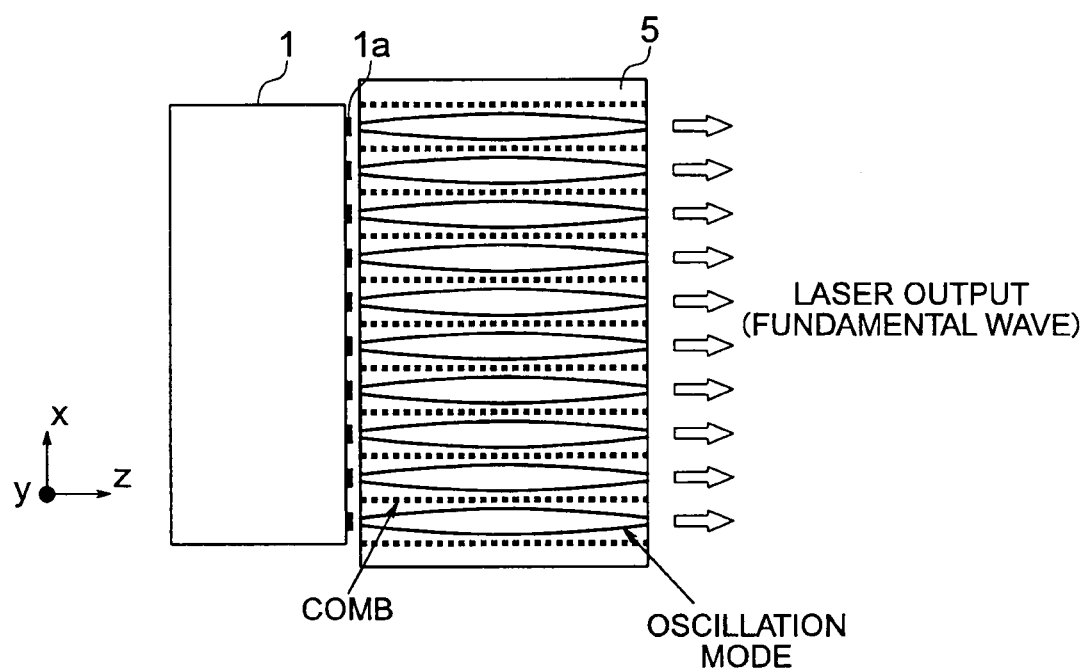
[FIG. 1D] A top view illustrating the structure of the plane waveguide type laser according to Embodiment 1 of the present invention.
Figure 8:
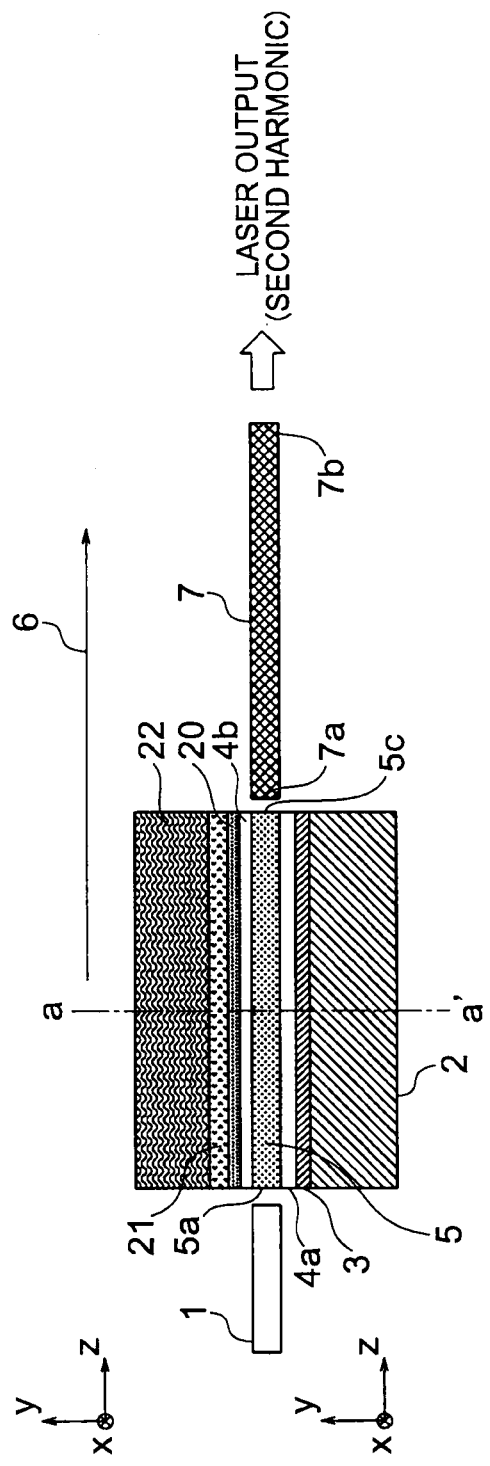
[FIG. 8] A side view illustrating a structure in which a nonlinear material 7 is provided on an output side along an optical axis in the plane waveguide type laser according to Embodiment 1 of the present invention.
Figure 10:
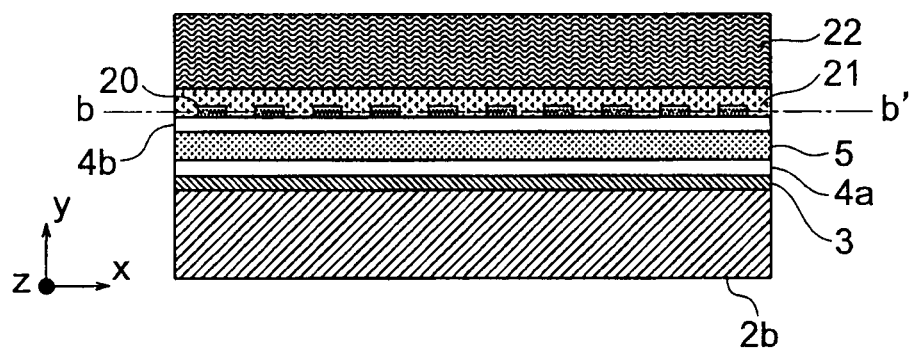
[FIG. 10] A cross sectional view illustrating a structure of a plane waveguide type laser according to Embodiment 3 of the present invention.

FIGS. 1A to 1D illustrate a structure of a plane waveguide type laser according to Embodiment 1 of the present invention. FIG. 1A is a side view illustrating the plane waveguide type laser according to Embodiment 1 of the present invention, FIG. 1B is a cross sectional view taken along the a-a' line illustrated in FIG. 1A, parts (c1) and (c2) of FIG. 10 are cross sectional views taken along the b-b' line illustrated in FIG. 1B, and FIG. 1D is a top view illustrating an oscillation mode of a laser resonator. As illustrated in FIGS. 1A to 1D, the plane waveguide type laser according to Embodiment 1 includes a semiconductor laser 1, a comb heat sink 2, a bonding material 3, first and second claddings (low-refractive index portions) 4a and 4b, a laser medium 5, and thermal lens producing means 20. Reference numeral 6 denotes an optical axis indicating a laser oscillation direction. As illustrated in FIG. 1, a bonding material 21 and a substrate 22 may be provided to enhance the strength of the laser medium 5. As illustrated in FIG. 8, a nonlinear material 7 may be provided on an output side of the plane waveguide type laser. Fundamental laser light output from the plane waveguide type laser enters the nonlinear material 7. The nonlinear material 7 reflects a part of the laser light and converts a remaining part thereof into laser light having a different wavelength to output the laser light.

The laser medium 5 is a substantially-rectangular plate member provided in a horizontal direction. Each of end surfaces 5a and 5b perpendicular to the optical axis 6 has a rectangular shape. To be specific, the end surfaces 5a and 5b are several pm to several ten μm in thickness in a y-axis direction (vertical direction) and several hundred μm to several μm in width in an x-axis direction (horizontal direction). In the following description, a coordinate system is employed in which the longitudinal direction of the rectangle of the laser medium 5 is set as an x-axis, the height direction thereof is set as a y-axis, and the optical axis 6 direction thereof is set as a z-axis.

The first and second claddings 4a and 4b have a refractive index smaller than that of the laser medium 5 and are bonded to surfaces of the laser medium 5 which are parallel to an xz plane. To be specific, the first cladding 4a is bonded to a lower surface of the laser medium 5 and the second cladding 4b is bonded to an upper surface of the laser medium 5. The first and second claddings 4a and 4b are formed as follows. For example, films made of an optical material as a raw material is formed on the laser medium 5 by evaporation, or the optical material is optically bonded to the laser medium 5 by optical contact or diffusion bonding. The first and second claddings 4a and 4b are used to form a waveguide in a direction vertical to the xz-plane of the laser medium 5.

As illustrated in FIG. 1B, the heat sink 2 has a comb shape. The heat sink 2 is made of a material with large thermal conductivity and bonded to the first cladding 4a through the bonding material 3.

The bonding material 3 discharges heat generated in the laser medium 5 to the heat sink 2 through the first cladding 4a. The bonding material 3 is metal solder, an optical adhesive, or a thermally conductive adhesive. The lower surface of the first cladding 4a, that is, the surface applied with the bonding material 3 may be metallized (deposited with metal film) in order to increase the strength of bonding with the bonding material 3. When the heat sink 2 is made of an optical material, the first cladding 4a and the heat sink 2 may be directly bonded to each other by, for example, optical contact or diffusion bonding without using the bonding material 3.

As illustrated in FIG. 1A, the semiconductor laser 1 is provided close to the end surface 5a of the laser medium 5. Excitation light enters the end surface 5a of the laser medium 5. Although not illustrated, if necessary, the semiconductor laser 1 may be bonded with a heat sink for cooling. As illustrated in FIG. 10, a length of the semiconductor laser 1 in the x-axis direction is substantially equal to a length of the laser medium 5 in the x-axis direction. Therefore, the semiconductor laser 1 substantially uniformly outputs the excitation light in the x-axis direction. As illustrated in FIG. 1C, the semiconductor laser 1 is, for example, a multi-emitter semiconductor laser in which a plurality of active layers 1a which output LD beams are arranged in the x-axis direction. In this case, the plurality of LD beams are output from the plurality of active layers 1a, and hence the plurality of laser output beams arranged in the x-axis direction are obtained. The LD beams output from the semiconductor laser 1 enter the laser medium 5 via the end surface 5a in an xz plane direction and are absorbed in the laser medium 5.

The thermal lens producing means 20 are arranged on an upper surface of the second cladding 4b formed on the upper surface of the laser medium 5. As illustrated in FIGS. 1A to 10, the thermal lens producing means 20 are band-shaped members parallel to the optical axis 6 indicating the laser oscillation direction and are provided between comb teeth of the comb heat sink 2 as illustrated in FIG. 1 as viewed from above. In the case of the multi-emitter semiconductor laser including the plurality of active layers 1a, the band-shaped thermal lens producing means 20 may be provided for each emitter. In this case, the thermal lens producing means 20 are arranged on a substantially upper side of the excitation beams output from the respective active layers 1a of the semiconductor laser 1.

The thermal lens producing means 20 may include band-shaped thin film resistors. In this case, the thermal lens producing means 20 generates heat when a voltage is applied between both ends of the band-shaped thin film resistors. As examples of the thermal lens producing means 20 including the plurality of band-shaped thin film resistors in the multi-emitter semiconductor laser 1, there are two examples illustrated in parts (c1) and (c2) of FIG. 10. That is, as illustrated in part (c1) of FIG. 10, the plurality of band-shaped thin film resistors may be connected in parallel. Alternatively, as illustrated in part (c2) of FIG. 10, the plurality of band-shaped thin film resistors may be connected in series. When a voltage is applied between both ends of the thin film resistors connected as described above, the thermal lens producing means 20 may generate heat on the upper side of the plurality of excitation beams.

The band-shaped thin film resistors included in the thermal lens producing means 20 may be formed by evaporation or plating on the entire upper surface of the second cladding 4b and then by selective etching for obtaining the band shape. A material of the thin film resistors which is used is, for example, Ni—P or Cr. Another material for evaporation or plating may be used.

The end surface 5a of the laser medium 5 is coated with a total-reflection film for reflecting the fundamental laser light and the end surface 5b is coated with an antireflection film for transmitting the fundamental laser light. In the case where the nonlinear material 7 is provided on the output side of the plane waveguide type laser as illustrated in FIG. 8, when an end surface which the laser output enters is assumed as an end surface 7a and an end surface from which second harmonic laser light is output is assumed as an end surface 7b, the end surface 7a is coated with an optical film which transmits the fundamental laser light and reflects the second harmonic laser light and the end surface 7b is coated with an optical film which reflects the fundamental laser light and transmits the second harmonic laser light. Each of the total-reflection film, the antireflection film, and the optical film is obtained by, for example, laminating dielectric thin films. When the excitation light output from the semiconductor laser 1 enters from the end surface 5a of the laser medium 5, the total-reflection film of the end surface 5a serves as an optical film which transmits the excitation light and reflects the fundamental laser light.

A general solid laser material maybe used as the laser medium 5. For example, Nd:YAG, Nd:YLF, Nd: Glass, Nd:YVO4, Nd:GdVO4, Yb:YAG, Yb:YLF, Yb:KGW, Yb:KYW, Er:Glass, Er:YAG, Tm:YAG, Tm:YLF, Ho:YAG, Ho:YLF, Tm, Ho:YAG, Tm, Ho:YLF, Ti:Sapphire, or Cr:LiSAF is used.

A general wavelength conversion material may be used as the nonlinear material 7. For example, KTP, KN, BBO, LBO, CLBO, LiNbO3, or LiTaO3 is used. When LiNbO3 doped with MgO, LiTaO3 doped with MgO, stoichiometric LiNbO3, or stoichiometric LiTaO3, which is highly resistant to optical damage, is used, high-efficiency frequency conversion may be performed because the power density of the incident fundamental laser light maybe increased. When LiNbO3 doped with MgO, LiTaO3 doped with MgO, stoichiometric LiNbO3, stoichiometric LiTaO3, or KTP, which has a periodic polarization reversal structure, is used, higher-efficiency frequency conversion may be performed because a nonlinear constant is large.

Figure 2:
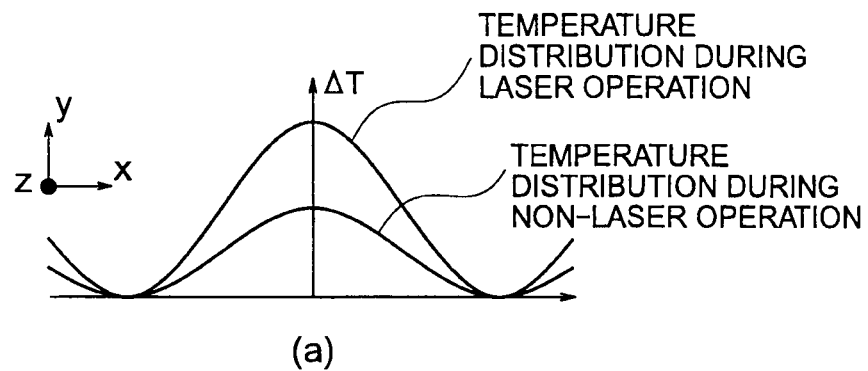
[FIG. 2] Partially enlarged cross sectional views illustrating the structure of the plane waveguide type laser according to Embodiment 1 of the present invention.
Figure 2:
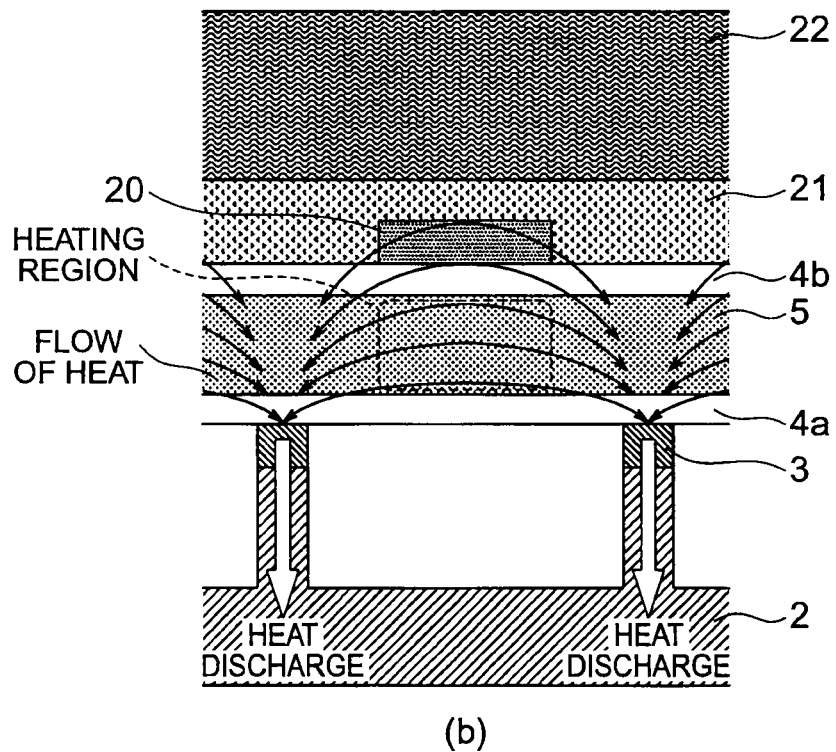

Next, a temperature distribution caused in the laser medium 5 is described with reference to FIG. 2. FIG. 2 is a partially enlarged cross sectional view illustrating the structure including from the heat sink 2 to the substrate 22 in FIG. 1B.

As illustrated in FIG. 2, a part of power of the excitation light which is emitted from the semiconductor laser 1 and absorbed in the laser medium 5 is converted into heat to generate heat in a heating region. The generated heat is transferred to the heat sink 2 through the first cladding 4a and the bonding material 3 and then discharged from the heat sink to an outside. In this case, the heat sink 2 has the comb shape and portions bonded to the first cladding 4a through the bonding material 3 correspond to only tip end portions of the comb teeth, and hence the flows of heat from substantially an intermediate point between the two comb teeth to both sides in the x-axis direction occur in an intermediate region between the two comb teeth. Therefore, a temperature at substantially the intermediate point between the two comb teeth is maximum and the temperature reduces with the approach to comb tooth portions (see temperature distribution illustrated in FIG. 2(a)).

An optical material of the laser medium 5 has a refractive index changed substantially proportional to a temperature difference. When a material of which a refractive index change per unit temperature dn/dT is positive is used, a refractive index of the intermediate portion between the two comb teeth which is high in temperature is large, and the refractive index reduces with the approach to the comb tooth portions. As a result, the thermal lens (thermal lens effect) having the intermediate portion between the two comb teeth as an optical axis is produced in the x-axis direction. The thermal lens (thermal lens effect) having the intermediate portion between the respective comb teeth as the optical axis is produced by the thermal lens producing means 20, and hence a periodic thermal lens effect is formed in the laser medium 5.

The laser medium 5 is exited at regular intervals by the plurality of active layers 1a of the semiconductor laser 1. As viewed from the upper surface, the excitation is provided between the comb teeth of the heat sink 2. The comb teeth of the heat sink 2 are arranged in the x-axis direction at substantially regular intervals. Therefore, the thermal lens effect is periodically produced. When the number of comb teeth is "m", an effect in a case where (m−1) lenses are arranged at substantially regular intervals is obtained. Strengths and period of thermal lenses which are periodically produced may be arbitrarily adjusted based on a comb tooth interval, comb tooth thickness, comb tooth length, and thermal conductivity of the heat sink 2, a thermal conductivity and thickness of the bonding material 3, and a material and thickness of the first and second claddings 4a and 4b.

As described above, the thermal lenses of the semiconductor laser 1 are produced in the laser medium 5 depending on the operation of the semiconductor laser 1. In contrast, the thermal lens producing means 20 includes the thin film resistors, and hence heat may be generated by voltage application. The thermal lens producing means 20 is located on the axis for excitation provided by the semiconductor laser 1, and hence the lens power of the thermal lenses produced by excitation may be increased. Even when excitation is not provided, thermal lenses may be produced in the laser medium 5 by heat generated in the thin film resistors included in the thermal lens producing means 20.

Next, an operation is described. The excitation light entering through the end surface 5a of the laser medium 5 is absorbed in the laser medium 5 to produce a gain for the fundamental laser light in the laser medium 5. FIGS. 1A and 1B illustrate a fundamental laser in which a partial reflection film reflecting a part of the fundamental laser light is formed on the end surface 5b of the laser medium 5 and laser oscillation is performed between the end surfaces 5a and 5b perpendicular to the optical axis 6 of the laser medium 5. FIG. 8 illustrates a structure in which an antireflection film 5c transmitting the fundamental laser light is formed on the end surface 5b of the laser medium 5 and the nonlinear material 7 is provided along the optical axis 6.

In the structure illustrated in FIG. 8, the fundamental laser light is generated by laser oscillation between the end surface 5a of the laser medium 5 and the end surface 7a of the nonlinear material 7 at the gain produced in the laser medium 5. The nonlinear material 7 is optimized in crystal axis angle, temperature, or periodic polarization reversal period so as to convert the fundamental laser light into the second harmonic laser light by a nonlinear effect at the time that the fundamental laser light enters. Therefore, when the fundamental laser light generated by oscillation between the end surfaces 5a and 7a enters the nonlinear material 7, a part of the fundamental laser light is wavelength-converted into the second harmonic laser light and output from the end surface 7b to the outside.

A remaining part of the fundamental laser light which is not converted into the second harmonic laser light is totally reflected on the end surface 7b, and passes through the nonlinear material 7 again to be converted into second harmonic laser light. The second harmonic laser light thus generated by converting the remaining part of the fundamental laser light is totally reflected on the end surface 7a and output from the end surface 7b to the outside.

As described above, the nonlinear material 7 is provided close to the end surface 5b of the laser medium 5 on the optical axis 6 of the laser medium 5, and acts as a wavelength selection waveguide for reflecting a part of the fundamental laser light having a desired wavelength and transmitting a part having other wavelengths.

The present invention may be applied to any of the structure for outputting the fundamental laser light and the structure for outputting the second harmonic laser light obtained by wavelength conversion, and hereinafter, the structure for outputting the fundamental laser light is described. Even in the case of the structure for outputting the second harmonic laser light obtained by wavelength conversion, the same feature is provided by the nonlinear material 7 disposed as a wavelength conversion element.

A thickness of the laser medium 5 in the y-axis direction is approximately several times to several ten times the wavelength. The laser medium 5 is interposed by air and the first and second claddings 4a and 4b which are smaller in refractive index than the laser medium 5, and thus acts as a waveguide in which the fundamental laser light is confined in the laser medium 5 having the high refractive index and the fundamental laser light is selectively generated by oscillation in a waveguide mode. The waveguide mode may be arbitrarily set by adjusting the refractive index of the first and second claddings 4a and 4b and the thickness of the laser medium 5 in the y-axis direction, and hence the waveguide may be operated in only a low-order mode or a single mode to realize high-intensity oscillation. A refractive index distribution is caused also in the y-axis direction because of a heat distribution caused by heat discharge. However, as long as the refractive index difference between the first and second claddings 4a and 4b and the laser medium 5 and the refractive index difference between air and the laser medium 5 are sufficiently larger than a refractive index change caused by the heat distribution, the waveguide mode becomes dominant, and hence the influence of heat may be neglected.

The nonlinear material 7 includes upper and lower surfaces which are perpendicular to the y-axis and interposed by air or claddings (not shown) smaller in refractive index than the nonlinear material 7. The nonlinear material 7 has a thickness which is approximately several times to several ten times the wavelength, and thus acts as a waveguide in the y-axis direction as in the case of the laser medium 5. For the case where the nonlinear material 7 absorbs laser light and generates heat, a heat sink may be bonded to the lower surface of the nonlinear material 7 or to a cladding bonded to the nonlinear material 7 to discharge heat. When the heat sink is directly bonded to the nonlinear material 7, an optical material smaller in refractive index than the nonlinear material 7, or a bonding material such as an optical adhesive smaller in refractive index than the nonlinear material 7 is used as a heat sink material so that the nonlinear material 7 in the y-axis direction may be used as the waveguide.

The laser oscillation of the laser resonator in the y-axis direction is selectively performed in the waveguide mode of the laser medium 5 or of the nonlinear material 7. Each of the waveguide mode of the laser medium 5 and the waveguide mode of the nonlinear material 7 may be arbitrarily set based on the thickness and the refractive index difference with the cladding, and hence the waveguide may be operated in only the low-order mode or the single mode to realize high-intensity oscillation.

The waveguide mode of the laser medium 5 and the waveguide mode of the nonlinear material 7 are not necessarily equal to each other. For example, when any one of the waveguide modes is set as a multi-mode and the other waveguide mode is set as the single mode, a laser oscillation mode is limited to a lowest-order mode, and hence selective oscillation may be performed in the single mode. It should be understood that a structure having the same waveguide mode may be employed.

In the laser oscillation of the laser resonator in the x-axis direction, the widths of the laser medium 5 and the nonlinear material 7 are sufficiently larger than the wavelengths of the fundamental laser light and the second harmonic laser light. Therefore, the selection of the waveguide mode is not performed, resulting in a space resonator. That is, in the x-axis direction, the periodic thermal lens effect is formed in the laser medium 5 by the thermal lens producing means 20 to perform laser oscillation in a plurality of resonant modes.

Next, operations in cases where the thermal lens is produced by the thermal lens producing means 20 and not produced are described.

Figure 3:
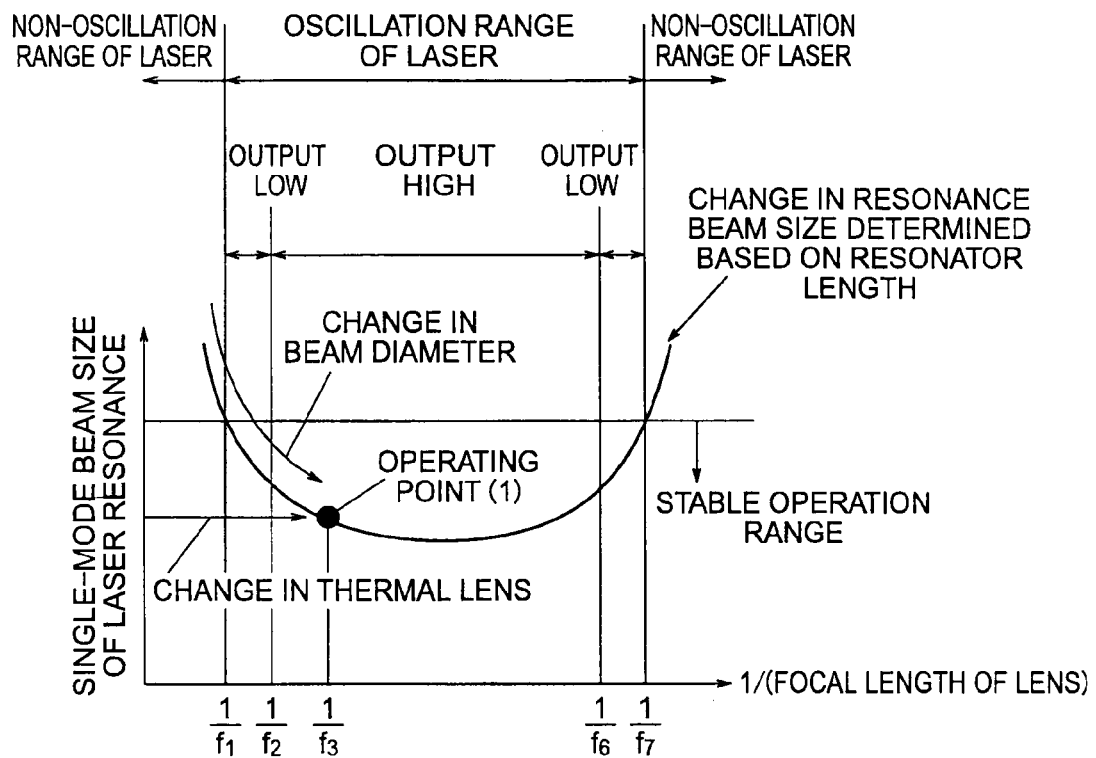
[FIG. 3] A view illustrating an operation of the plane waveguide type laser according to Embodiment 1 of the present invention in a case where a thermal lens is not produced.
Figure 5:
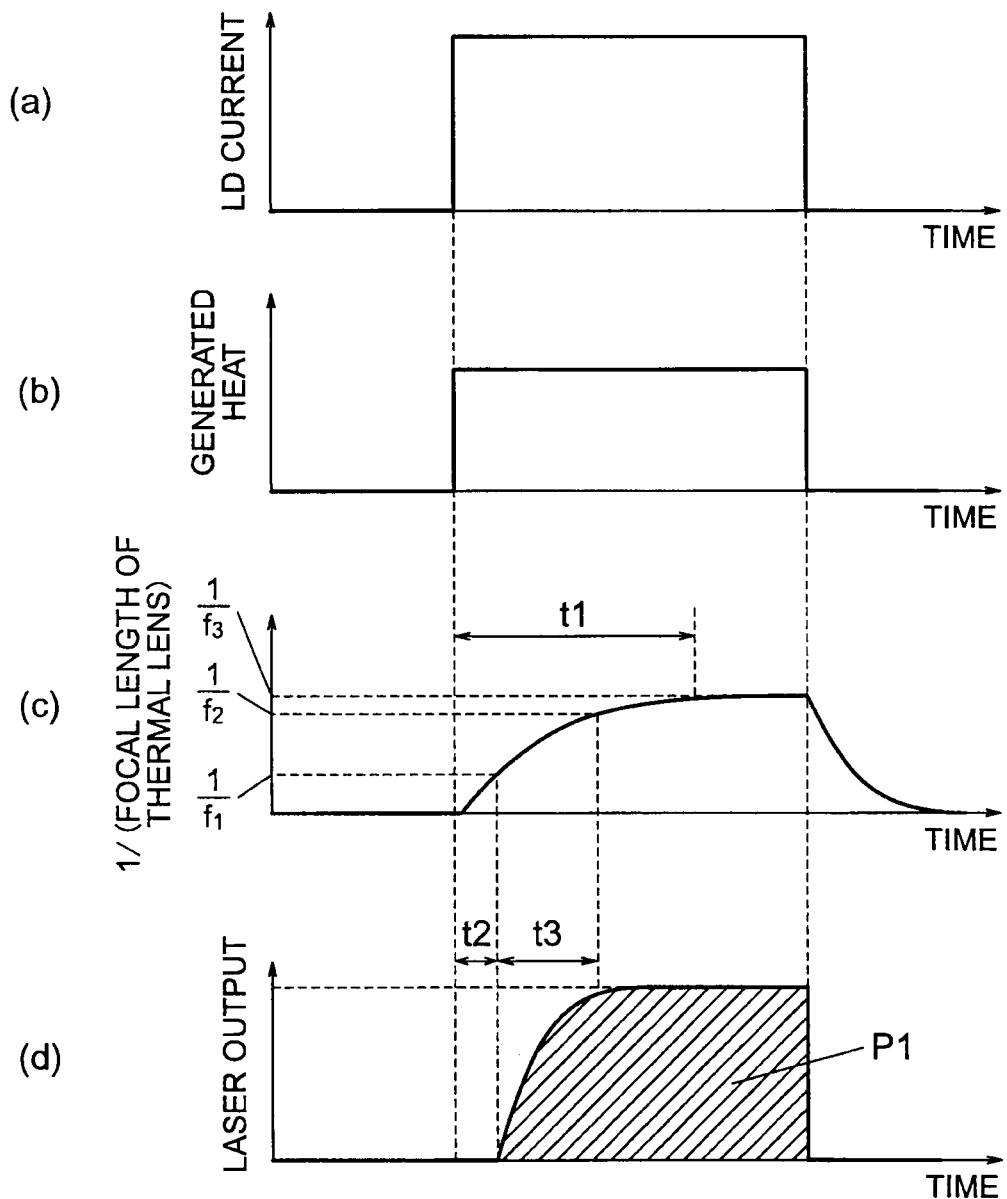
[FIG. 5] Time waveform diagrams illustrating a semiconductor laser, generated heat, lens power, and a pulse operation of a laser output in the case where the thermal lens is not produced in the plane waveguide type laser according to Embodiment 1 of the present invention.

First, the case where the thermal lens is not produced by the thermal lens producing means 20 is described. FIG. 5 illustrates time waveforms with respect to an operation of a semiconductor laser, generated heat, lens power (1/focal length of thermal lens), and a pulse operation of laser output. FIG. 3 is an explanatory diagram illustrating an operation at the time of rising of the pulse or CW operation. When an LD current waveform (FIG. 5(a)) is rectangular at the time of rising of the pulse or CW operation, a waveform of generated heat (FIG. 5(b)) in a solid laser medium is also rectangular substantially depending on the LD current waveform. However, the production response of the thermal lens is delayed depending on the amount of generated heat, the comb tooth interval, comb tooth thickness, comb tooth length, and thermal conductivity of the heat sink 2, the thermal conductivity and thickness of the bonding material 3, the material and thickness of the first and second claddings 4, and the thermal resistance of each of the materials. Therefore, the lens power (1/focal length of thermal lens) (FIG. 5(c)) gradually increases from the start of operation of the LD current and becomes lens power in a steady state after a period t1. After the stop of the LD current, the lens power (FIG. 5(c)) gradually weakens. As illustrated in FIG. 3, when the lens power is small, a single-mode beam size of laser resonance is large, and hence a round-trip loss is large. The round-trip loss is larger than an amplification gain of the laser medium 5, and hence oscillation is not performed. In contrast, when the lens power gradually increases and becomes stronger than 1/f1, laser oscillation starts. The single-mode beam size of laser resonance becomes smaller and a resonance loss gradually reduces to increase the laser output. In a range in which the lens power is stronger than 1/f2 and weaker than 1/f6, a round-trip loss caused depending on a beam diameter reduces and other loss factors of round-trip laser light (for example, waveguide loss of waveguide, reflection loss of end surface coating of laser medium 5, and loss of coupling with wavelength conversion element 7) are dominant, and hence the laser output is constant without depending on the beam diameter. The laser operation becomes stable at an operating point (1) at which the lens power increases and finally becomes 1/f3, which is lens power in the steady state. Because the lens power increases from the start of operation of the LD current as described above, as illustrated in FIG. 5(*d*), oscillation is not performed during a period t2 for which the lens power reaches 1/f1, and laser output is not obtained. Then, during a period t3 for which the lens power increases from 1/f1 to 1/f2, the beam diameter becomes smaller and the round-trip loss reduces to increase the laser output. Before the lens power increases from 1/f2 to 1/f3 corresponding to the steady state, the laser power is already output in the steady state. Thus, in order to stably output the laser power in the steady state, it is necessary to wait for a lapse of a period (t2+t3) from the start of operation of the LD current. When such a light source is utilized for, for example, a TV using a laser as a light source, there is a problem that display colors are changed to lower image quality because the output at the time of rising is small.

Figure 4:
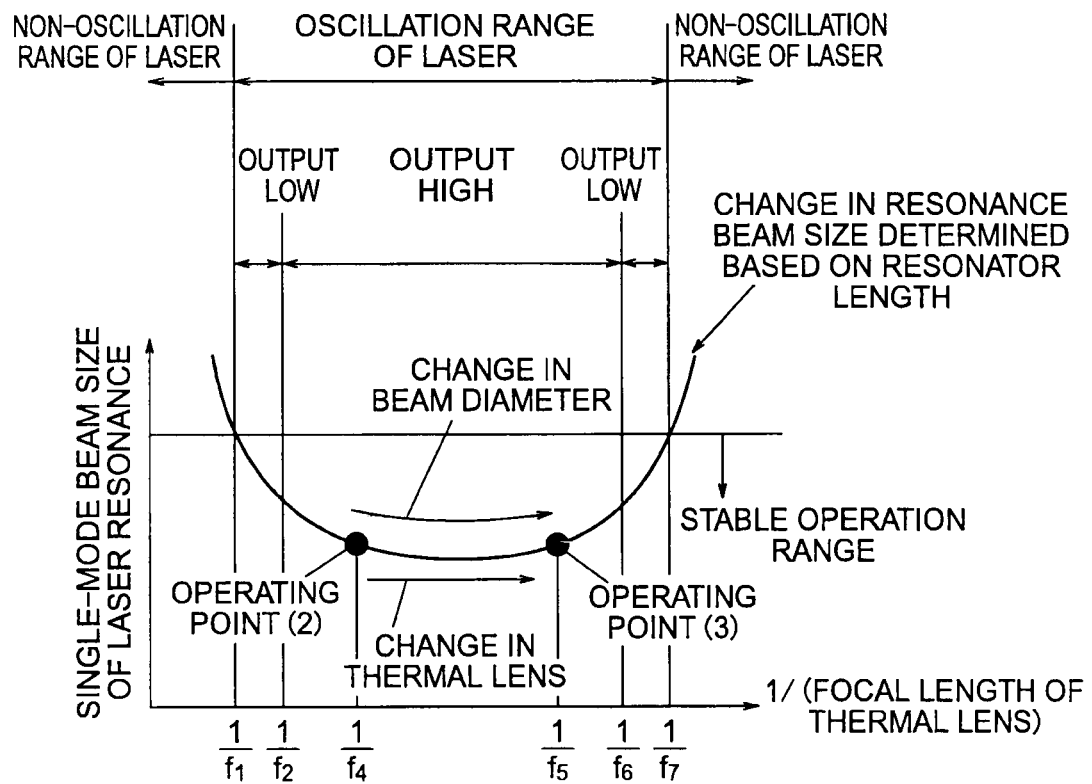
[FIG. 4] A view illustrating an operation of the plane waveguide type laser according to Embodiment 1 of the present invention in a case where the thermal lens is produced.
Figure 6:
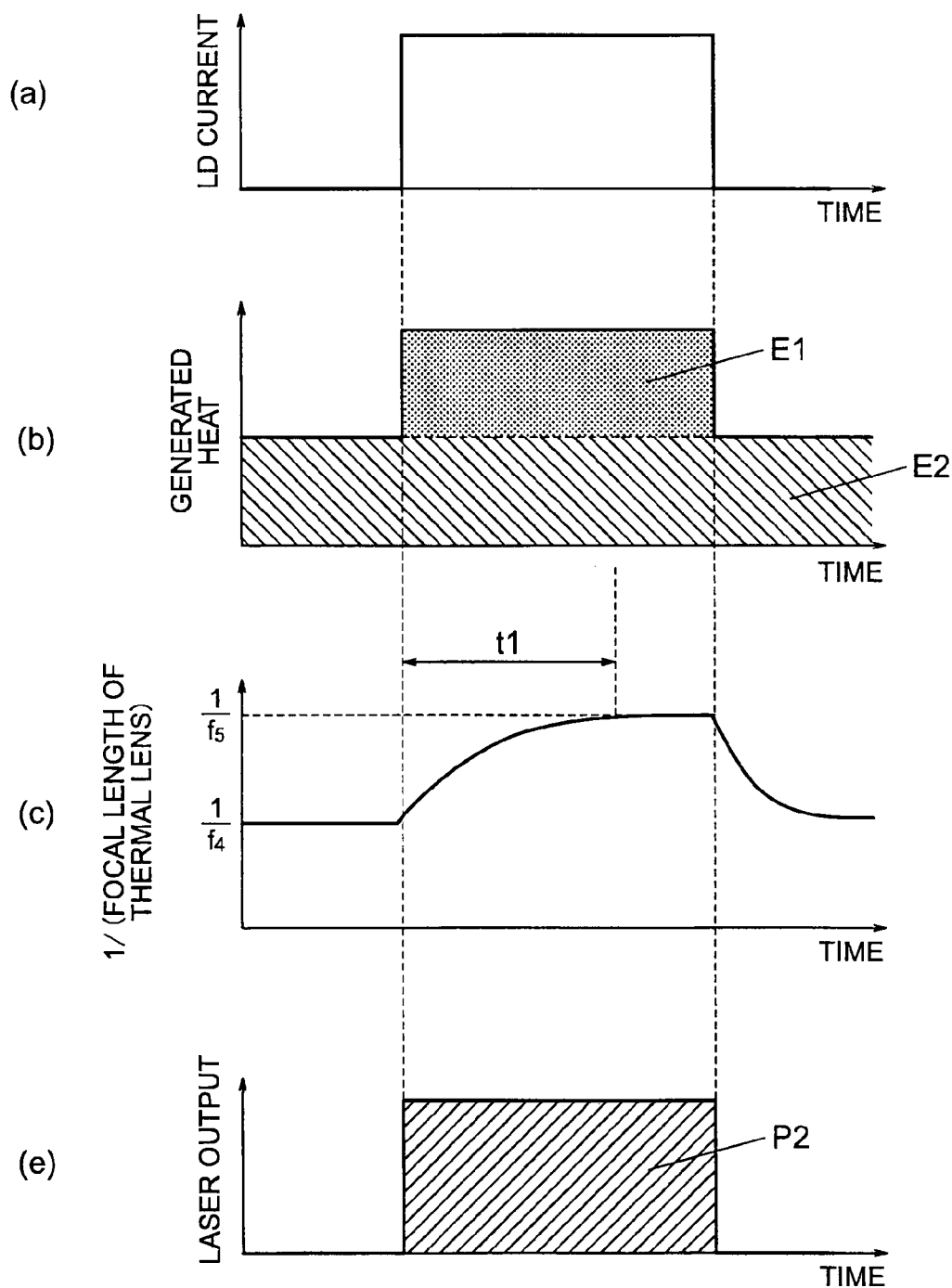
[FIG. 6] Time waveform diagrams illustrating the semiconductor laser, the generated heat, the lens power, and the pulse operation of the laser output in the case where the thermal lens is produced in the plane waveguide type laser according to Embodiment 1 of the present invention.

Next, the case where the thermal lens is produced by the thermal lens producing means 20 is described. FIG. 6 illustrates time waveforms with respect to an operation of the semiconductor laser, generated heat, lens power (1/focal length of thermal lens), and a pulse operation of laser output. FIG. 4 is an explanatory diagram illustrating an operation at the time of rising of the pulse or CW operation. Heat is steadily generated by the thermal lens producing means 20 (E2 illustrated in FIG. 6(*b*)), and hence the lens power is 1/f4 before the operation of the LD. The lens power of 1/f4 is set in a lens power range in which the steady laser output is obtained (1/f2 to 1/f6). Therefore, at the time of start of laser operation, the operation is performed at an operating point (2) illustrated in FIG. 4. When an LD current waveform (FIG. 6(*a*)) is rectangular at the time of rising of the pulse or CW operation, a waveform of generated heat (E1 illustrated in FIG. 6(*b*)) in a solid laser medium is also rectangular substantially depending on the LD current waveform. Thus, during the operation of the LD current, the heat is generated in an amount corresponding to a total of heat generated by the thermal lens producing means 20 and heat generated by excitation. The lens power gradually increases from the start of operation of the LD current because of heat generated by excitation, and becomes 1/f5 which is lens power in the steady state after a lapse of a period t1. After the stop of the LD current, the lens power gradually weakens and becomes 1/f4 which is lens power caused by the thermal lens producing means 20. When 1/f5 which is the lens power of the thermal lens in the steady state during the operation of the LD current is set in the lens power range in which the steady laser output is obtained (1/f2 to 1/f6), constant laser output is obtained without depending on a change in lens power which is caused by the operation of the LD current. Therefore, in the steady state, the operation is performed at an operating point (3) illustrated in FIG. 4. Thus, there is an effect that a maximum output is obtained immediately after the start of operation of the LD current and stable laser light output is obtained during any of the rising period of the pulse operation and the rising period of the CW operation.

In the range in which the lens power is 1/f2 to 1/f6, the round-trip loss caused depending on the single-mode beam size reduces and the other loss factors of round-trip laser light (for example, waveguide loss of waveguide, reflection loss of end surface coating of laser medium 5, and loss of coupling with wavelength conversion element 7) are dominant, and hence the laser output is constant without depending on the beam diameter. In contrast, an excitation range is not changed because of a semiconductor laser. Therefore, when the single-mode beam size changes, a transverse mode of a laser oscillation beam changes. When the single-mode beam size is small, high-order transverse mode laser oscillation is performed. Thus, the laser output does not change, but beam quality changes. As described above, there is a feature that the beam quality is not constant but changes at the rising of the pulse or CW operation in which the lens power of the thermal lens is not in the steady state.

Figure 7:
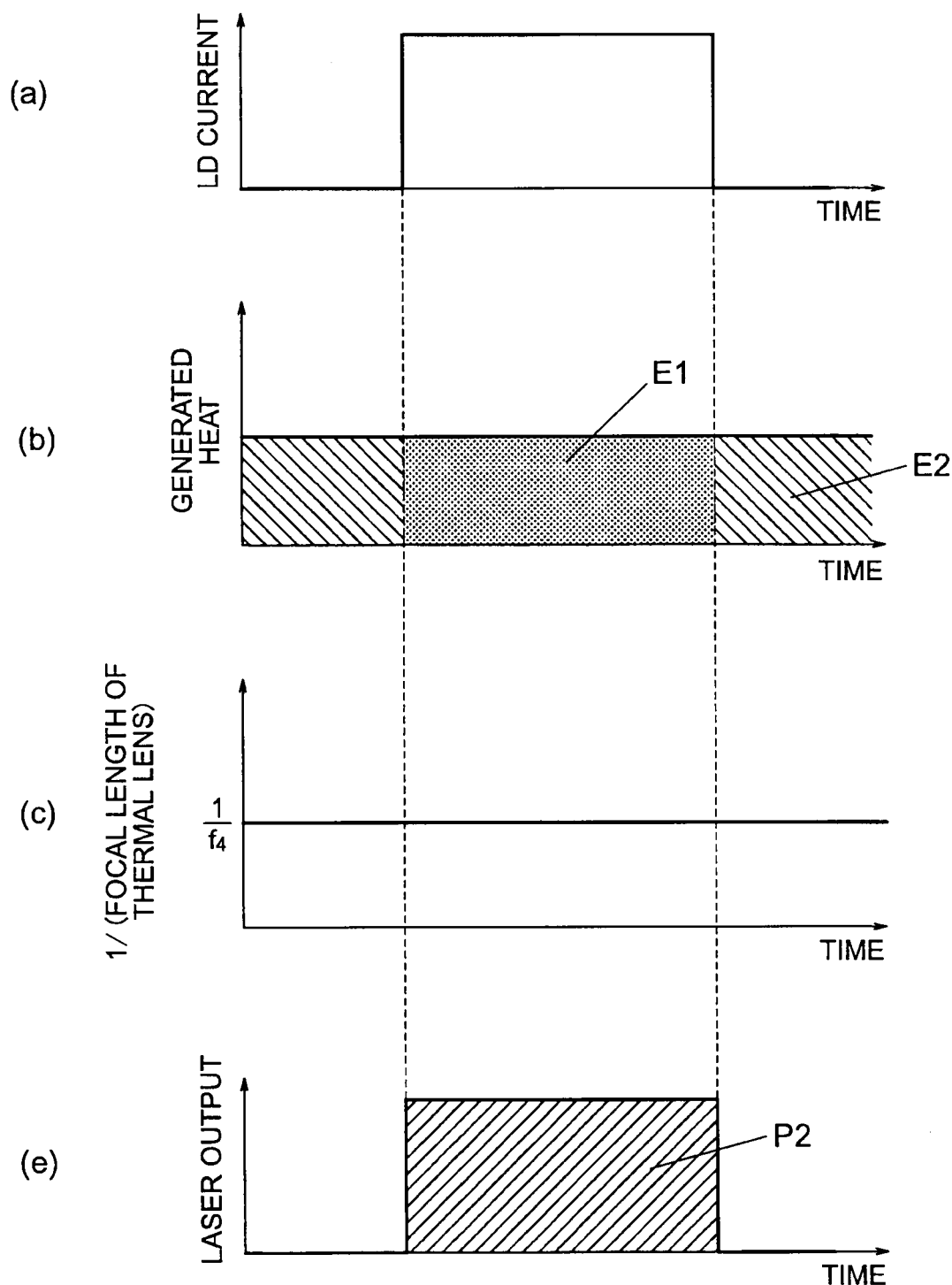
[FIG. 7] Time waveform diagrams illustrating the semiconductor laser, the generated heat, the lens power, and the pulse operation of the laser output in a case where an operation of thermal lens producing means is not a continuous operation in the plane waveguide type laser according to Embodiment 1 of the present invention.

Next, a case where setting is made so that the thermal lens producing means 20 does not operate continuously, namely, the thermal lens producing means 20 operates during only a period for which the semiconductor laser is not driven is described. As illustrated in FIG. 7(*b*), setting is made so that the thermal lens producing means 20 generates the amount of heat equal to the amount of heat generated by excitation during the driving of the LD current and operates during only the period for which the semiconductor laser is not driven. Therefore, the total amount of heat does not depend on the operation of the LD current and thus is constant. Even when the pulse operation is performed, the lens power does not change. Thus, there are effects that stable laser light output is obtained during any of the rising period of the pulse operation and the rising period of the CW operation and that the single-mode beam diameter of laser resonance does not change because of no change in thermal lens, to thereby always maintain the beam quality of the laser output constant.

As described above, the plane waveguide type laser according to Embodiment 1 of the present invention includes the substantially plate-shaped laser medium 5 provided in the horizontal direction, the semiconductor laser 1 which is provided close to the one end surface 5*a* of the laser medium 5 on the optical axis 6 of the laser medium 5, for causing the excitation light to enter the laser medium 5, the first cladding 4*a* which is bonded to the lower surface of the laser medium 5 to form the waveguide in the vertical direction of the laser medium 5, the second cladding 4*b* which is bonded to the upper surface of the laser medium 5 to form the waveguide in the vertical direction of the laser medium 5, the heat sink 2 bonded to the lower surface of the first cladding 4*a*, the wavelength selection waveguide which is provided close to the other end surface 5*b* of the laser medium 5 on the optical axis 6 of the laser medium 5, for reflecting the laser light having a predetermined wavelength which is the part of the fundamental laser light exiting from the laser medium 5, and transmitting the laser light having other wavelengths, and the thermal lens producing means 20 bonded to the upper surface of the second cladding 4*b*. The wavelength selection waveguide is made of the nonlinear material 7 to convert the fundamental laser light entering the wavelength selection waveguide into the laser light having the different wavelength and to output the laser light. With such a structure, the plane waveguide type laser according to Embodiment 1 performs laser oscillation in the y-axis direction (vertical direction) in the waveguide mode of the laser medium 5 (waveguide of nonlinear material 7 when nonlinear material 7 is provided), and performs laser oscillation in the x-axis direction (lateral direction) in the plurality of resonant modes by the periodic lens effect formed in the laser medium 5 by the thermal lens producing means 20. Therefore, a resonator having a small round-trip loss maybe formed without depending on the size of the thermal lens produced by excitation, and hence the rising characteristic of the pulse operation or CW operation may be smoothed to obtain high-power stable output.

Figure 12:
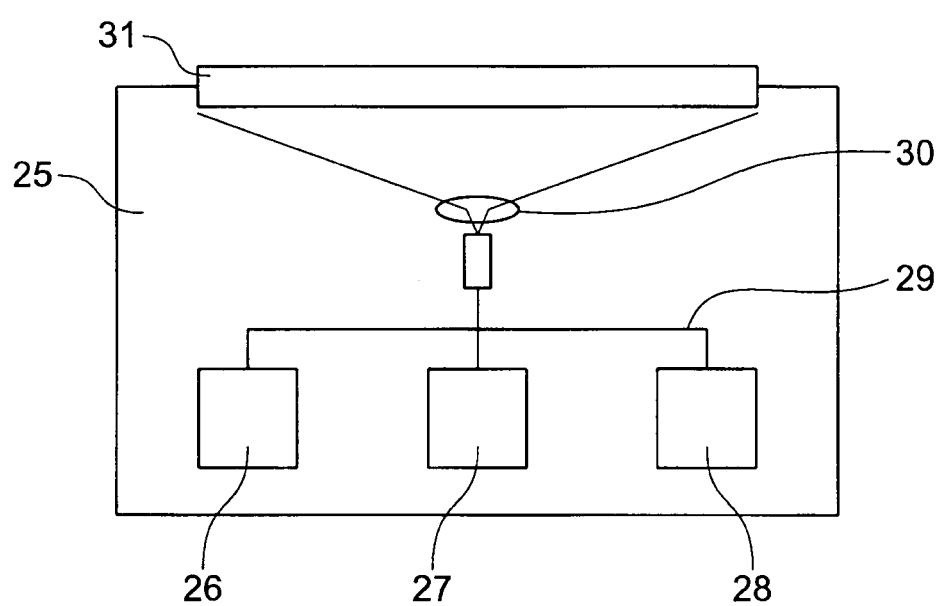
[FIG. 12] A structural view illustrating a display device using the plane waveguide type laser according to any of Embodiments 1 to 3 of the present invention as a light source.
Figure 13:
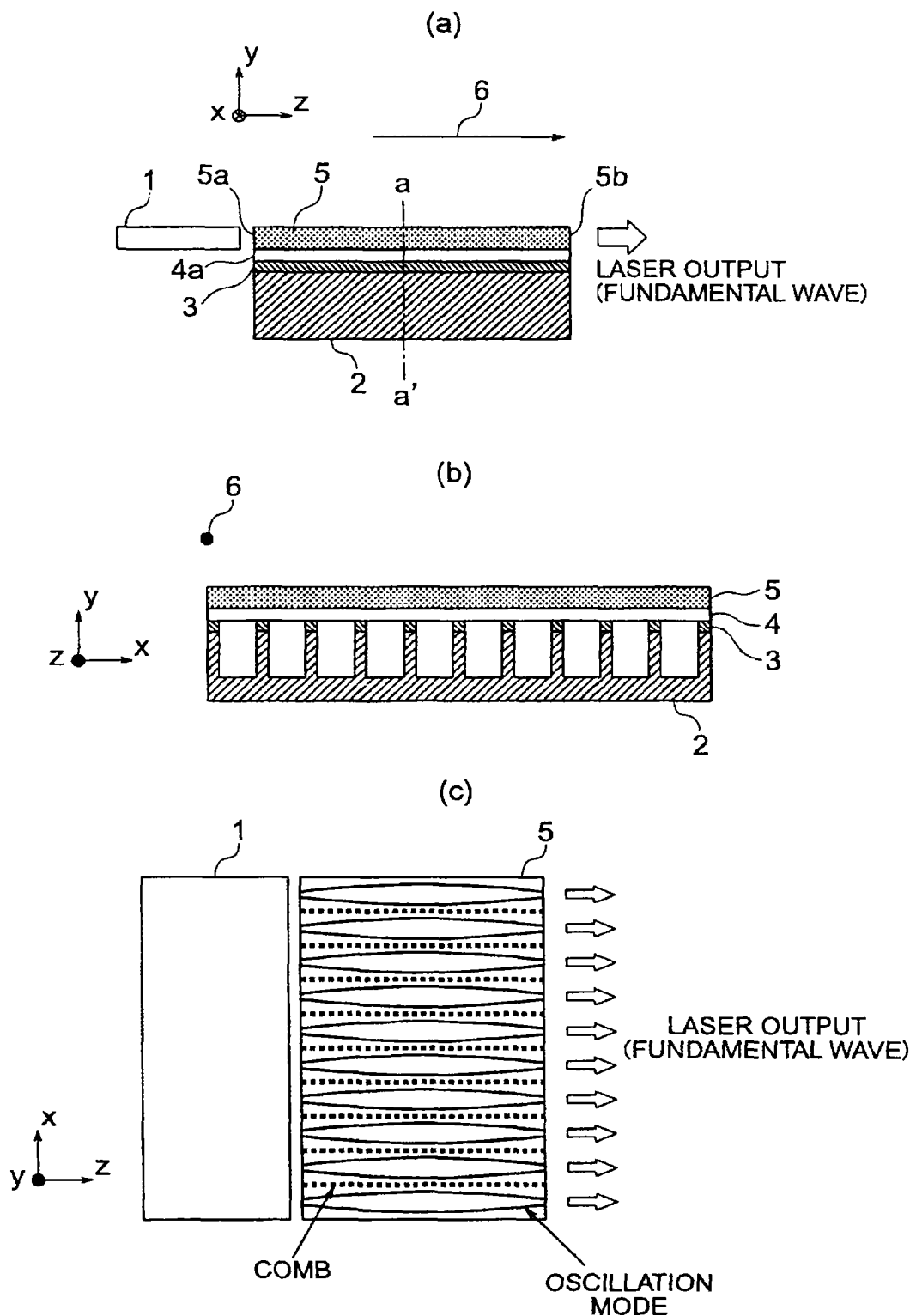
[FIG. 13] Views illustrating a structure of a conventional plane waveguide type laser.
Figure 14:
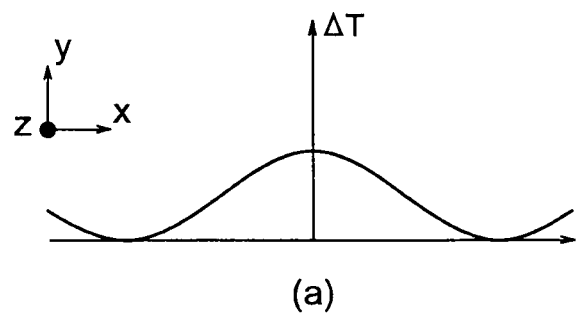
[FIG. 14] Diagrams illustrating a temperature distribution and a flow of heat in the conventional plane waveguide type laser.
Figure 14:
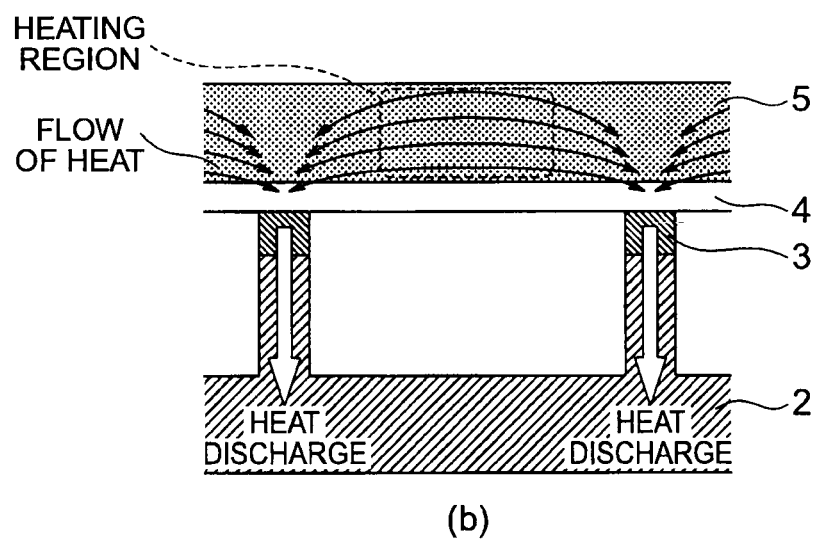

The plane waveguide type laser according to Embodiment 1 maybe applied for, for example, a television set or display device using a laser as a light source. Examples of the application using the laser as the light source include backlights of a rear-projection TV, a front-projection TV, and a liquid crystal TV. In addition to the examples, the laser may be applied to various television sets or display devices. FIG. 12 illustrates a typical structural example of a laser television set using the wavelength conversion laser according to the present invention as the light source. As illustrated in FIG. 12, a laser television set 25 includes a red light source 26, a green light source 27, a blue light source 28, light propagation means 29 connected to the light sources 26 to 28, an optical system 30 connected to the light propagation means 29, and a screen 31 to which an image from the optical system 30 is projected. Respective beams emitted from the red light source 26, the green light source 27, and the blue light source 28 are coupled to one another through the light propagation means 29, guided to the optical system 30, and projected to the screen 31 by the optical system 30. Each of the red light source 26, the green light source 27, and the blue light source 28 are composed of the plane waveguide type laser according to Embodiment 1. When the plane waveguide type laser according to Embodiment 1 is used for the light source for television set and the light source for display device as described above, a laser television set and a display device with excellent color reproducibility, high intensity, high resolution, high color gamut, and low power consumption may be realized.

Embodiment 2

Figure 9:
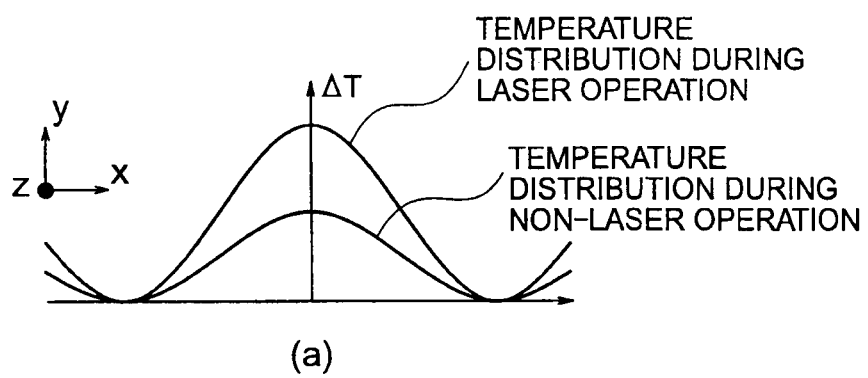
[FIG. 9] Partially enlarged cross sectional views illustrating a structure of a plane waveguide type laser according to Embodiment 2 of the present invention.
Figure 9:
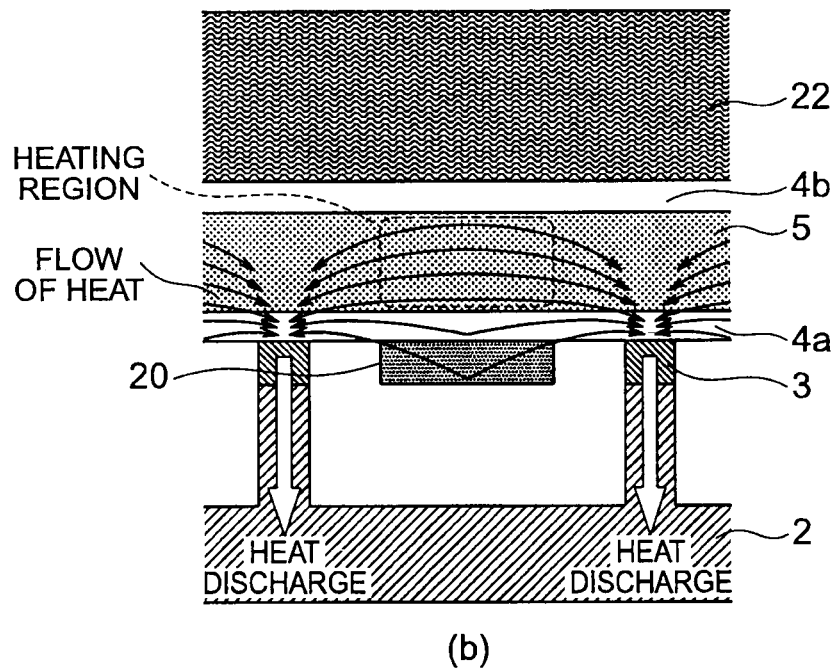

FIG. 9 illustrates a structure of a plane waveguide type laser according to Embodiment 2 of the present invention. The structure illustrated in FIG. 9 is fundamentally the same as the structure illustrated in FIG. 1, unless otherwise specified. Hereinafter, the point different from the structure illustrated in FIG. 1 is described. FIG. 9 is a partially enlarged cross sectional view illustrating an enlarged part of the cross sectional view along the line a-a' illustrated in FIG. 1A. Similarly to Embodiment 1, the plane waveguide type laser according to Embodiment 2 may be applied to a laser television set and a display device.

In Embodiment 2, as illustrated in FIG. 9, the thermal lens producing means 20 is provided on the lower surface of the first cladding 4a. Similarly to Embodiment 1, the thermal lens producing means 20 may include the band-shaped thin film resistors. The band-shaped thin film resistors included in the thermal lens producing means 20 may be formed by evaporation or plating on the entire lower surface of the first cladding 4a and then by selective etching for obtaining the band shape. As illustrated in FIG. 9, the band-shaped thin film resistors included in the thermal lens producing means 20 are arranged between the comb teeth of the heat sink 2 having the comb structure. When an adhesive, for example, a resin is used as the bonding material 3 applied to the tip ends of the comb teeth, the adjacent thin film resistors may be insulated from each other, and hence the thin film resistors may be connected in series or in parallel as illustrated in the parts (c1) and (c2) of FIG. 10. When a metal-based bonding material, for example, solder is used as the bonding material 3, it is desired that only the upper portions of the comb teeth of the heat sink 2 be selectively bonded. In order to facilitate wirings to the thin film resistors, it is desired that the size of the substrate 22 and the size of the bonding material 21 (not shown) be set to be smaller than the size of the plate surface of the laser medium 5.

As described above, even in Embodiment 2, similarly to Embodiment 1, the laser oscillation in the y-axis direction (vertical direction) is performed in the waveguide mode of the laser medium 5 or the wavelength conversion waveguide, and the laser oscillation in the x-axis direction (horizontal direction) is performed in the plurality of resonant modes by the periodic lens effect formed in the laser medium 5 by the thermal lens producing means 20. Therefore, a resonator having a small round-trip loss may be formed without depending on the size of the thermal lens produced by excitation, and hence the rising characteristic of the pulse operation or CW operation may be smoothed to obtain high-power stable output.

In Embodiment 2, the thermal lens producing means 20 is provided on the lower surface of the first cladding 4a and heat is continuously generated so that a maximum output is obtained immediately after the start of operation of the LD current and stable laser light output is obtained during any of the rising period of the pulse operation and the rising period of the CW operation.

The thermal lens producing means 20 is operated during only the period for which the semiconductor laser 1 is not driven. Therefore, stable laser light output is obtained during any of the rising period of the pulse operation and the rising period of the CW operation. Further, the single-mode beam diameter of laser resonance does not change because of no change in thermal lens, and hence the beam quality of the laser output is always maintained constant.

The thermal lens producing means 20 is provided on the lower surface of the first cladding 4a, and hence there is no step on a bonding surface between the second cladding 4b and the substrate 22 to obtain a strong bonding strength. Therefore, the rigidity of the entire element is increased and long-term reliability is improved. Because of no step, the bonding material 21 is unnecessary, and hence a manufacturing process is facilitated and a reduction in cost is achieved correspondingly.

Embodiment 3

Figure 11:
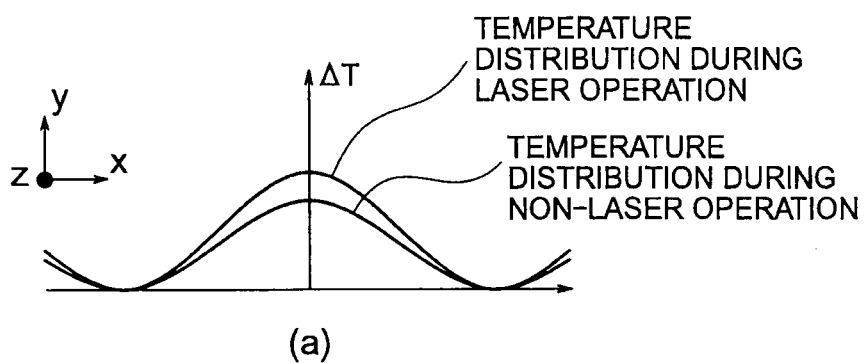
[FIG. 11] Partially enlarged cross sectional views illustrating the structure of the plane waveguide type laser according to Embodiment 3 of the present invention.
Figure 11:
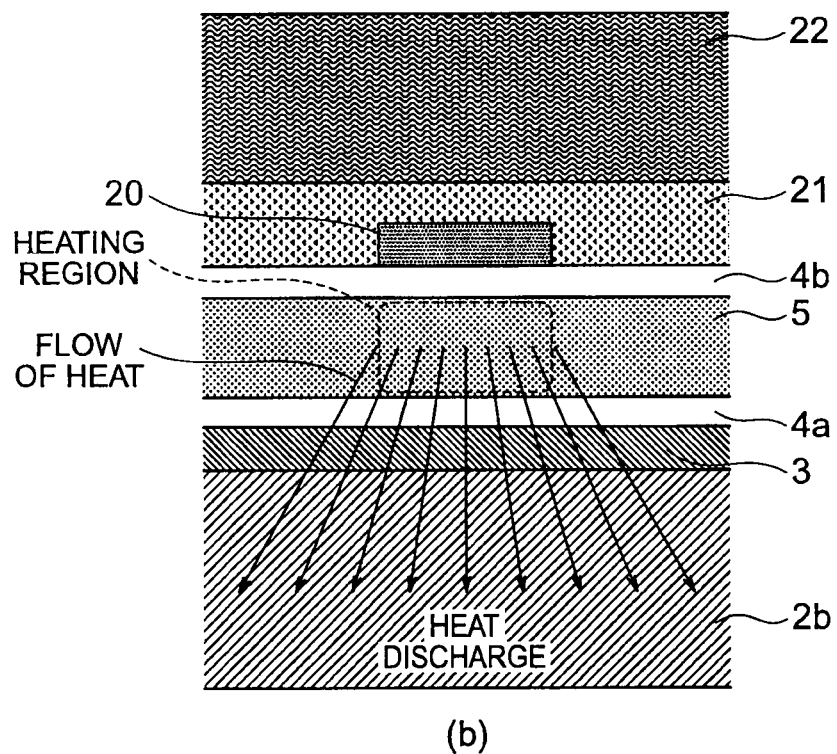

FIG. 10 and FIG. 11 illustrate a structure of a plane waveguide type laser according to Embodiment 3 of the present invention. The structure illustrated in FIG. 10 is fundamentally the same as the structure illustrated in FIG. 1, unless otherwise specified. Hereinafter, the point different from the structure illustrated in FIG. 1 is described. FIG. 10 is a cross sectional view illustrating a cross sectional view along the line a-a' illustrated in FIG. 1A, and FIG. 11 is a partially enlarged cross section view illustrating an enlarged part of the cross sectional view along the line a-a' shown in FIG. 10. Similarly to Embodiments 1 and 2, the plane waveguide type laser according to Embodiment 3 may be applied to a laser television set and a display device.

In Embodiment 3, the entire surface of the first cladding 4a provided on the lower surface of the laser medium 5 is bonded to the entire surface of a heat sink 2b through the bonding material 3. In Embodiment 3, the heat sink 2b is not formed into the comb shape and the bonding surface has a planar shape. Because the entire surface of the first cladding 4a is bonded to the entire surface of the heat sink 2b through the bonding material 3, there is an effect that the rigidity of the plane waveguide type laser is increased and the long-term reliability is improved.

However, because of the entire surface bonding of the first cladding 4a, the lens power of the thermal lens caused by excitation by the semiconductor laser 1 reduces. The excitation region becomes a heating region, and heat is discharged to the heat sink 2b while diffusing. As compared with the cases of comb bonding described in Embodiments 1 and 2, the bonding surface in Embodiment 3 is larger, and hence the thermal resistance is small and thus an increase in temperature of the laser medium 5 is small. Therefore, since the lens power of the thermal lens is small, when the thermal lens producing means 20 does not operate, even the thermal lens in the steady state is larger than the single-mode beam diameter capable of performing laser oscillation. Thus, the loss of the resonator is large, and hence laser oscillation is difficult.

Therefore, in Embodiment 3, a steady sufficient amount of heat is electrically generated in the thermal lens producing means 20 to obtain the thermal lens capable of performing laser oscillation even when the thermal resistance is small. At the rising of the pulse operation and the rising of the CW operation, the temperature is increased by heat generated by the excited LD to increase the lens power of the thermal lens. However, the entire surface of the heat sink 2b is bonded and the thermal resistance is small, and hence the change in lens power which is caused by the operation of the excited LD is smaller than in the case of bonding of the comb heat sink 2. Thus, when the thermal lens producing means 20 is operated to generate heat for obtaining the single-mode beam size in which the loss of the resonator is sufficiently small, there are effects that high-power laser output is stably obtained from the start of driving of the LD current and that the change in beam quality is small because of a small change in lens power which is caused by heat generated by the excited LD. There is also an effect that the control is simple, for example, it is sufficient that a constant DC current is supplied to the thermal lens producing means 20 and thus the control depending on the operation of the excited LD is unnecessary.

As described above, even in Embodiment 3, similarly to Embodiments 1 and 2, the laser oscillation in the y-axis direction (vertical direction) is performed in the waveguide mode of the laser medium 5 or the wavelength conversion waveguide, and the laser oscillation in the x-axis direction (horizontal direction) is performed in the plurality of resonant modes by the periodic lens effect formed in the laser medium 5 by the thermal lens producing means 20. Therefore, a resonator having a small round-trip loss may be formed without depending on the size of the thermal lens produced by excitation, and hence the rising characteristic of the pulse operation or CW operation may be smoothed to obtain high-power stable output.

In Embodiment 3, the heat sink 2b is formed into not the comb shape but the planar shape for the bonding surface to make the entire surface bonding of the heat sink 2b to the first cladding 4a, and hence the thermal resistance is small and the change in lens power which is caused by the operation of the excited LD is small. Therefore, the thermal lens producing means 20 is operated to generate heat for obtaining a sufficient small resonator loss, thereby providing the effect that high-power laser output is stably obtained from the start of driving of the LD current.

In the description, Embodiment 3 is applied to the structure according to Embodiment 1 as illustrated in FIG. 1. However, Embodiment 3 may be applied to the structure according to Embodiment 2 as illustrated in FIG. 9. Even in such a case, the same effect is obtained.

The invention claimed is:

1. A plane waveguide type laser, comprising:
a substantially plate-shaped laser medium;
a semiconductor laser disposed close to one end surface of the laser medium on an optical axis of the laser medium, for inputting excitation light into the laser medium;
a first cladding bonded to a lower surface of the laser medium for forming a waveguide in a vertical direction to the laser medium;
a second cladding bonded to an upper surface of the laser medium for forming the waveguide in the vertical direction to the laser medium;
a heat sink bonded to a lower surface of the first cladding;
a wavelength selection waveguide disposed close to another end surface of the laser medium on the optical axis of the laser medium, for reflecting laser light having a predetermined wavelength which is a part of fundamental laser light exiting from the laser medium, and transmitting remaining laser light having other wavelengths; and
thermal lens producing means bonded to an upper surface of the second cladding,
wherein laser oscillation in the vertical direction is performed in a waveguide mode of the laser medium or the wavelength selection waveguide,
wherein the thermal lens producing means forms a periodic thermal lens effect in the laser medium so that laser oscillation in a horizontal direction is performed in a plurality of resonant modes, and
wherein the wavelength selection waveguide includes a nonlinear material, and converts the fundamental laser light entering the wavelength selection waveguide into laser light having a different wavelength to output the laser light.

2. A plane waveguide type laser, comprising:
a substantially plate-shaped laser medium;
a semiconductor laser disposed close to one end surface of the laser medium on an optical axis of the laser medium, for inputting excitation light into the laser medium;
a first cladding bonded to a lower surface of the laser medium for forming a waveguide in a vertical direction to the laser medium;
a second cladding bonded to an upper surface of the laser medium for forming the waveguide in the vertical direction to the laser medium;
a heat sink bonded to a lower surface of the first cladding; and
thermal lens producing means bonded to an upper surface of the second cladding,
wherein laser oscillation in the vertical direction is performed in a waveguide mode of the laser medium, and
wherein the thermal lens producing means forms a periodic thermal lens effect in the laser medium so that laser oscillation in a horizontal direction is performed in a plurality of resonant modes.

3. A plane waveguide type laser, comprising:
a substantially plate-shaped laser medium;
a semiconductor laser disposed close to one end surface of the laser medium on an optical axis of the laser medium, for inputting excitation light into the laser medium;
a first cladding bonded to a lower surface of the laser medium for forming a waveguide in a vertical direction to the laser medium;
a second cladding bonded to an upper surface of the laser medium for forming the waveguide in the vertical direction to the laser medium;
a heat sink bonded to a lower surface of the first cladding;
a wavelength selection waveguide disposed close to another end surface of the laser medium on the optical axis of the laser medium, for reflecting laser light having a predetermined wavelength which is a part of fundamental laser light exiting from the laser medium, and transmitting remaining laser light having other wavelengths; and
thermal lens producing means bonded to a lower surface of the first cladding,
wherein laser oscillation in the vertical direction is performed in a waveguide mode of the laser medium or the wavelength selection waveguide,
wherein the thermal lens producing means forms a periodic thermal lens effect in the laser medium so that laser oscillation in a horizontal direction is performed in a plurality of resonant modes, and wherein the wavelength selection waveguide includes a nonlinear material, and converts the fundamental laser light entering the wavelength selection waveguide into laser light having a different wavelength to output the laser light.

4. A plane waveguide type laser, comprising:

a substantially plate-shaped laser medium;

a semiconductor laser disposed close to one end surface of the laser medium on an optical axis of the laser medium, for inputting excitation light into the laser medium;

a first cladding bonded to a lower surface of the laser medium for forming a waveguide in a vertical direction to the laser medium;

a second cladding bonded to an upper surface of the laser medium for forming the waveguide in the vertical direction to the laser medium;

a heat sink bonded to a lower surface of the second cladding; and thermal lens producing means bonded to a lower surface of the first cladding, wherein laser oscillation in the vertical direction is performed in a waveguide mode of the laser medium, and wherein the thermal lens producing means forms a periodic thermal lens effect in the laser medium so that laser oscillation in the horizontal direction is performed in a plurality of resonant modes.

5. A plane waveguide type laser according to claim 1, wherein:

the heat sink comprises a comb structure in a cross section perpendicular to the optical axis;

a bonding surface of the heat sink comprises tip end portions of comb tooth of the comb structure; and the periodic thermal lens effect is formed based on a periodic temperature distribution caused by heat which is generated in the laser medium and transferred to and discharged at the tip end portions of the comb tooth.

6. A plane waveguide type laser according to claim 1, wherein the thermal lens producing means comprises a plurality of band-shaped structures selectively formed in a region which is parallel to the optical axis and adjacent to the excitation light from the semiconductor laser.

7. A plane waveguide type laser according to claim 6, wherein the plurality of band-shaped structures of the thermal lens producing means comprise thin film resistors.

8. A display device, comprising a light source, wherein the light source is the plane waveguide type laser according to claim 1.

9. A display device, comprising a light source, wherein the light source is the plane waveguide type laser according to claim 2.

10. A display device, comprising a light source, wherein the light source is the plane waveguide type laser according to claim 3.

11. A display device, comprising a light source, wherein the light source is the plane waveguide type laser according to claim 4.

* * * * *